United States Patent

Konishi et al.

[11] 4,028,650
[45] June 7, 1977

[54] MICROWAVE CIRCUITS CONSTRUCTED INSIDE A WAVEGUIDE

[75] Inventors: Yoshihiro Konishi, Sagamihara; Kenichi Konno, Tokyo; Norihiko Yazawa, Kawasaki; Norio Hoshino, Tokyo, all of Japan

[73] Assignee: Nippon Hoso Kyokai, Tokyo, Japan

[22] Filed: May 8, 1975

[21] Appl. No.: 575,512

Related U.S. Application Data

[63] Continuation of Ser. No. 361,817, May 18, 1973, Pat. No. 3,914,713.

[30] Foreign Application Priority Data

May 23, 1972 Japan .............................. 47-50993

[52] U.S. Cl. ............................................ 333/73 W
[51] Int. Cl.² ............................................ H01P 1/20
[58] Field of Search ............ 333/21 R, 73 W, 84 R, 333/58 R

[56] References Cited

UNITED STATES PATENTS

| | | | |
|---|---|---|---|
| 2,923,901 | 2/1960 | Robertson | 333/73 W |
| 3,732,508 | 5/1973 | Ito et al. | 333/84 R |
| 3,914,713 | 10/1975 | Konishi et al. | 333/73 W |

*Primary Examiner*—John K. Corbin
*Assistant Examiner*—Wm. H. Punter
*Attorney, Agent, or Firm*—Stevens, Davis, Miller & Mosher

[57] ABSTRACT

By inserting a rectangular conductive flat member having uninterrupted straight edges into a waveguide in contact relation of their edge portions to the waveguide walls in parallel with an electric field therein, cut-off frequencies at portions of the waveguide to which the conductive flat member is inserted become higher to form a cut-off region. The conductive flat member is composed of a conductor plate or by evaporating a conductive thick film on a dielectric or magnetic plate. The conductive flat member occasionally lined with a non-conductive flat member is provided with circuit elements such as slots formed by punching and strip lines or semiconductor diodes formed by evaporation, and microwave circuits having various functions such as filter circuits, directional couplers, oscillator circuits, frequency converter circuits, frequency multiplier circuits, switch circuits, phase shifter circuits, etc. are constructed on the conductive flat member by combination of the circuit elements through mutual coupling therebetween. These microwave circuits are coupled to transmission regions of the waveguide adjoining both sides of the cut-off region by circuit elements located at the end portion of the conductive flat member. Accordingly, only by inserting into the waveguide a conductive flat member on which various circuit elements are provided, desired microwave circuits of various kinds are constructed very easily inside the waveguide. Such microwave circuits are small in size and low in transmission loss due to elimination of waveguide converters conventionally used, and are suitable for massproduction due to simplicity of structure and ease of manufacturing and assembling which result from mechanical working technique of high degree being unnecessary.

5 Claims, 34 Drawing Figures

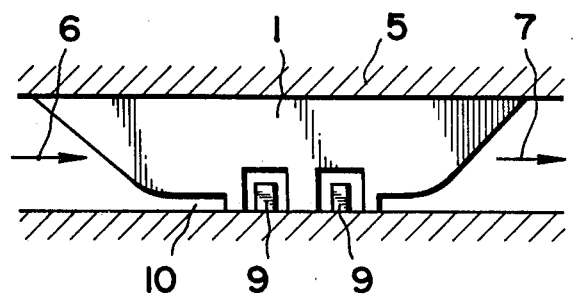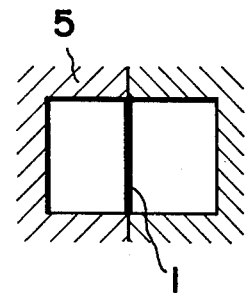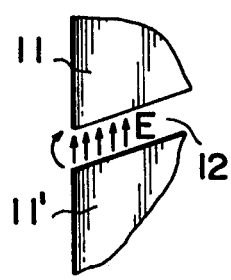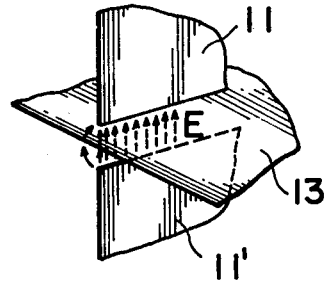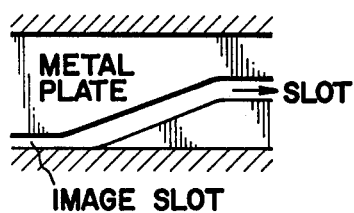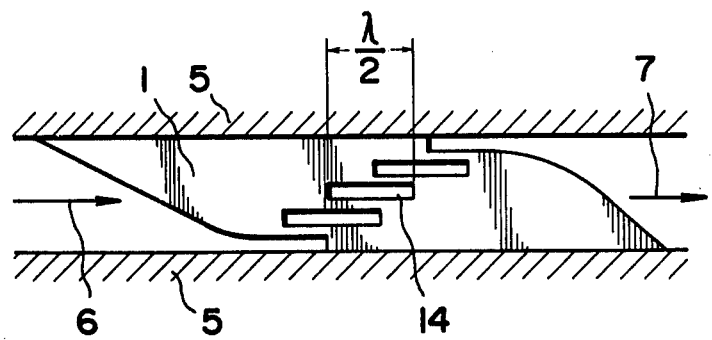

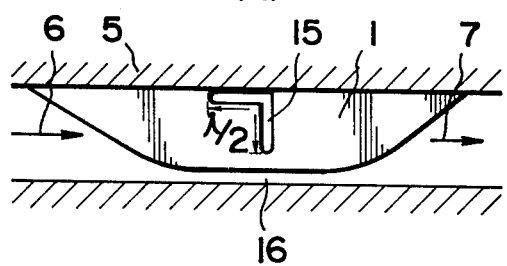
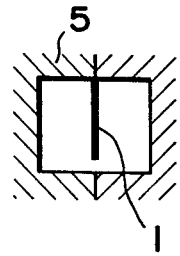
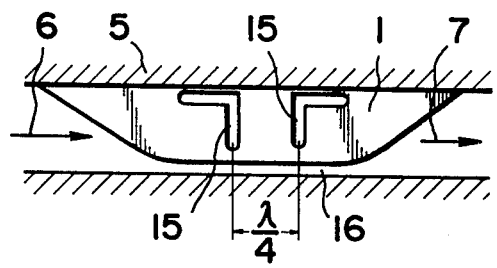
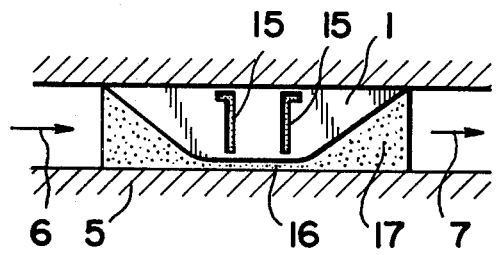
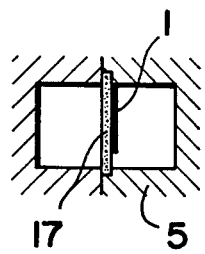

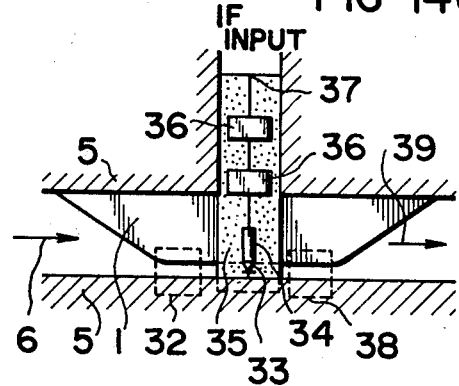
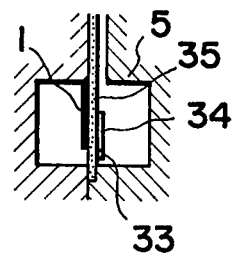
FIG-14a
FIG-14b
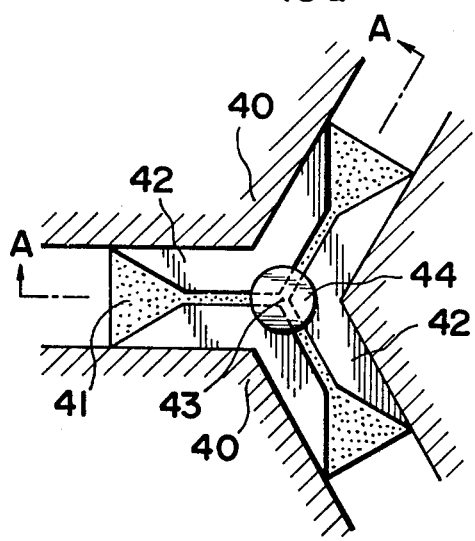
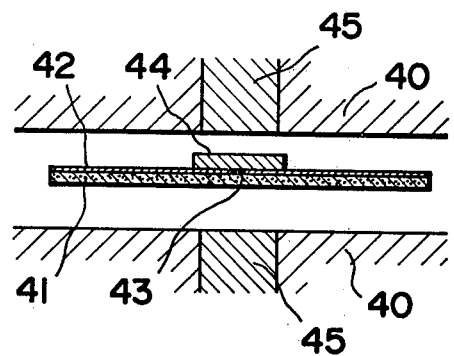
FIG-15a
FIG-15b

MICROWAVE CIRCUITS CONSTRUCTED INSIDE A WAVEGUIDE

This is a continuation of application Ser. No. 361,817 filed May 18, 1973, now U.S. Pat. No. 3,914,713.

BACKGROUND OF THE INVENTION

This invention relates to microwave circuits, and particularly, to basic microwave circuits with which various microwave devices of different functions can be realized with simple structure without need of waveguide converter portions.

Recently, study on miniaturization of microwave circuits has progressed and integrated-circuit (so-called IC) technology therefor has been developed. According to such technique, microwave circuits are formed in small size by metal-evaporating circuit elements consisting of a strip line or slotted line on dielectric or magnetic base plates. However, with respect to loss these are inferior to waveguides as transmission line, so that microwave devices using IC circuits, in general, are constructed by a combination of IC circuits and waveguides as the transmission line, both of them being connected by means of waveguide converters. Therefore, as a whole of the device an extra space is required owing to the waveguide converter portion and loss caused thereat is added. If circuit elements were formed inside a waveguide, unless all of them are constructed on a one-body plate inserted into it, mechanical working therefor needs a considerably higher degree of machining and assembling, so that such a way is not suitable for mass-production and presents difficulty of reduction in size.

SUMMARY OF THE INVENTION

Accordingly, it is a primary object of the invention to provide microwave circuits which are preferred for mass-production with lesser number of components and are smaller sized, wherein difficulty in manufacturing and assembling circuit elements constructed inside a waveguide are obviated by using very simple working of the microwave circuit which is suitable for mass-production, the waveguide being subjected to inserting in parallel with its E-plane one-body flat base plates, which can be produced on a large scale in such a manner that circuit elements in the form of a slot circuit, strip line or modified slot line as explained later are arranged on the base plates, so that microwave devices are constructed without necessity of waveguide converter portions.

The invention is characterized in that inside of a waveguide a one-body conductive flat member is provided in parallel with its E-plane so as to form a cut-off region, whereby desired functions are obtained by mutual coupling between a plurality of circuit elements comprising any of slot circuits formed on said conductive flat member and strip lines formed on a non-conductive flat member lining it and by coupling between the transmission region of said waveguide and said circuit elements.

According to the invention, one-body conductive plates or those combined with dielectric or magnetic non-conductive plates are provided with circuit elements in the form of a slot line, strip line or modified slot line of image type, and subsequently such plates are inserted into the waveguide in parallel with its E-plane.

When the conductive plate is inserted at the center of the waveguide, a cut-off frequency thereof which is double of that before insertion of the plate is obtained. Consequently, electromagnetic waves of the waveguide mode over the frequency band available before insertion of the plates are brought into the cut-off condition, and hence not transmitted through the waveguide, unless another technique is provided.

BRIEF DESCRIPTION OF THE DRAWINGS

FIGS. 4a and 4b show longitudinal and transverse sections of a further band pass filter of a modified slot type according to the invention, respectively;

FIG. 5a is a schematic view for explanation of a slot line of a conventional type;

FIG. 5b is a similar schematic view for explaining a slot line of an image type;

FIG. 5c is a schematic sectional view showing conversion from image type to conventional type of slot lines;

FIG. 6 shows in longitudinal section another band pass filter of the slot type;

FIGS. 7a and 7b show longitudinal and transverse sections of a narrow band elimination filter according to the invention, respectively;

FIG. 8 shows a longitudinal section of a further narrow band elimination filter according to the invention;

FIGS. 9a and 9b show longitudinal and transverse sections of another narrow band elimination filter according to the invention, respectively;

FIGS. 14a and 14b show longitudinal and transverse sections of an embodiment of an up-converter according to the invention, respectively;

FIG. 15a is a schematic plan view of an embodiment of an E-plane circulator according to the invention;

FIG. 15b is a sectional view taken along line A—A in FIG. 15a;

FIG. 16b is an elevation of a plane circuit to be inserted along line A″-B″-C″ in FIG. 16a.

DESCRIPTION OF THE PREFERRED EMBODIMENTS

Figure 1A:
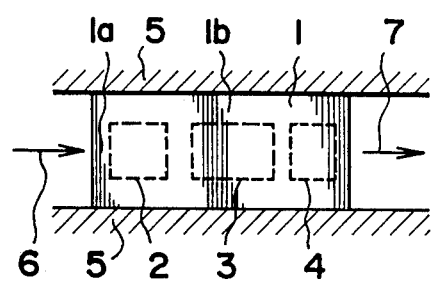
FIG. 1a shows schematically a basic construction of a microwave circuit of the invention in longitudinal section parallel to the E-plane of the waveguide.

It should be noted that in the drawing the same numeral represents the same portion.

Figure 1B:
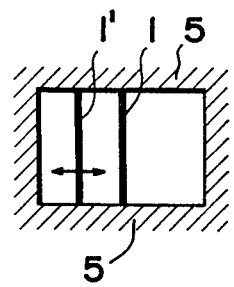
FIG. 1b shows a transverse section shown in the circuit of FIG. 1a perpendicular to the axis of the waveguide.

Referring to FIGS. 1a and 1b a basic construction of a microwave circuit arrangement according to the invention will be explained hereinbelow. In these figures terminals of a waveguide 5 are shown as comprising two openings. However, according to circuit arrangements one or more openings can be provided, and the whole of the input and output portions need not necessarily be constructed with the waveguide, so that part of them may be formed by a slotted line. A single conductive flat plate 1 is mounted within the waveguide 5 in parallel with the E-plane thereof. This plate has substantially the same height along its length as the full inner height of the waveguide. The plate 1 has uninterrupted straight edges adjacent to the input and output openings of the waveguide. The term "uninterrupted straight edge" means that one of the edges of, for example, conductive flat member 1 near end portion 1A does not have a slot line opening for guiding an electric field in a transmission region of the waveguide into the cut-off region of the waveguide. On the single conductive flat plate 1 consisting of a conductor plate or a conductive plate lined with a dielectric or magnetic base plate are provided various microwave planar circuit elements 2, 3 and 4, which are inserted into the waveguide 5 in parallel with its E-plane.

Now, the operation of such a microwave circuit arrangement will be explained in detail. An input electromagnetic field 6 is coupled at an end portion 1a of an inserted plate 1 (conductive plate mentioned above) beyond its rectangular edge to a circuit element 2 provided thereon closely adjacent to the transmission region of the waveguide and renders excitation of the circuit element 2. At a middle portion 1b of the insertion plate 1, where the mode of the waveguide for the frequency band utilized is in cut-off due to the insertion plate being conductive, the input electromagnetic field 6 of the waveguide 5 is attenuated sufficiently within the region of the inserted conductive plate and thus is never coupled directly to an output side 7 of the waveguide 5. Nevertheless, the electromagnetic energy which has excited the circuit element 2 provided on the inserted plate 1 enters into a circuit element 4 through a circuit element 3, and then consequently is coupled to the output side 7 of the waveguide 5. With such construction, microwave devices occupy minimal inner space of the waveguide, and besides can be obtained by simple working, that is, inserting the one-body conductive plate 1 into the waveguide 5, previously provided with microwave circuit elements before the insertion, for example by punching for metallic plates or by an evaporation technique or thick film printing technique of metal with the aid of dielectric or magnetic base plates, thereby reducing the size of devices and enabling mass-production. Such microwave devices can be used for filter circuits, directional couplers, oscillating circuits, frequency converter circuits, switch circuits, multiplier circuits, phase shifter circuits, etc. Various embodiments of such microwave circuit arrangements will be explained below.

Band Pass Filter (1-1) An embodiment wherein resonators of the lumped constant type are formed on a one-body rectangular conductive plate.

Figure 2A:
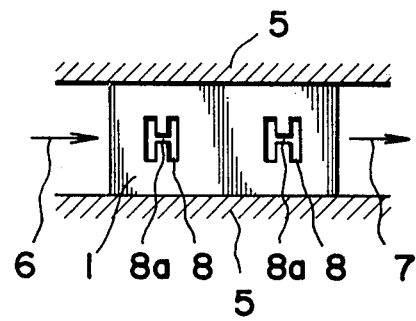
FIGS. 2a and 2b show longitudinal and transverse sections of an embodiment of a lumped constant-type band pass filter according to the invention, respectively.
Figure 2B:
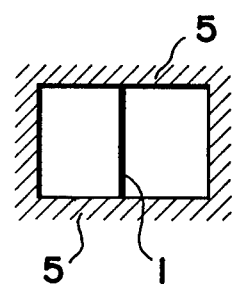
Figure 3:
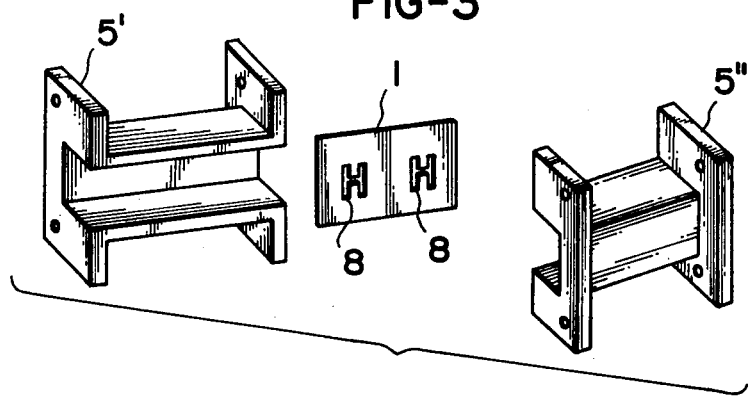
FIG. 3 is a fragmentary perspective view of the embodiment shown in FIG. 2.

FIG. 2a shows a longitudinal section of the embodiment in which the waveguide 5 is cut in parallel to the E-plane, and FIG. 2b shows a transverse section of the waveguide 5. As shown in FIG. 2b, the rectangular conductor plate 1 having uninterrupted straight edges is inserted into the center of the waveguide 5, and the conductor plate 1 is provided with resonators 8 in the form of a slot as illustrated in FIG. 2a. In this embodiment the resonators 8 are shown as being formed by the slots each punched in the shape of an H. However, the resonators are not restricted to the H-shape and can be obtained by an opening of any shape such as a rectangular or circular form punched on the conductor plate. In the H-shaped resonator 8 its horizontal slot portion 8a serves as a capacitor of the lumped constant type, rendering the slot type resonator 8 small sized and facilitating its frequency adjustment. According to the structure shown in FIGS. 2a and 2b, a band pass filter can be constructed, as shown in FIG. 3, by sandwiching the conductor plate 1 between two waveguide portions 5' and 5'' which are obtained by dividing the waveguide 5 into two parts. In such configuration, respective components can easily be manufactured and assembled and consequently are suitable for mass-production. That is to say, only punching of a thin metallic single plate is needed as for the conductor plate 1, and it is sufficient for the waveguide 5 to form plastic material, etc. in the mold and then to cover it with metallic foil or be subjected to metal plating. Moreover, when the position of the filter is desired to be shifted upon adjustment of the circuit, it can easily be realized by moving the conductor plate 1 backward or forward in the axial direction of the waveguide 5. In addition, if a variable pass band is required, this can be achieved by inserting a second conductor plate 1' into the waveguide 5 in parallel to the first conductor plate 1 as shown in FIG. 1b in a manner such that the distance between the conductor plate 1' and the conductor plate 1 forming the resonator assembly can be changed.

(1-2) An embodiment using a slotted line of modified form at the portion coupling with the transmission region of the waveguide.

FIGS. 4a and 4b illustrate an embodiment employing a modified-type slotted line 10 incorporated with the conductor plate 1 between a transmission region of the waveguide 5 and a pair of resonators 9 on the plate 1. This modified-type slotted line 10 has such a construction that at the center of a slot portion 12 of the slotted line formed by two conductor plates 11 and 11' as shown in FIG. 5a is inserted a conductive plate 13 corresponding to the wall surface of the waveguide 5 shown in FIG. 4a, and hence a slot line of image type is formed as shown in FIG. 5b. This may be considered to be a kind of thin type ridge line inside of the waveguide. It should be noted that conversion between an image-type slot line and a conventional-type slot line can easily be accomplished by a circuit as illustrated in FIG. 5c.

Generally, a conventional type slot line is composed of a pair of thin coplanar conductive plates having cooperating edges spaced apart along the narrow interspace between them for forming therealong a continuous wave path closely confining the wave energy, so that it requires a mechanical working technique of a high degree and presents difficulty in manufacturing and assembling such cooperating edges exactly spaced along their entire length. Also, the area of the conductive plates composing the slot line and inserted into a waveguide of specified size, is too narrow to provide desired circuit elements of various kinds required for the object of this invention. On the contrary, a single conductive plate is used as for the image-type slot line in a state opposed to the wide wall surface of a waveguide; therefore it is very easy and effective to construct the slot line inside the waveguide and to provide desired circuit elements on the conductive plate composing the slot line.

(1-3) An embodiment constructed by a filter of the slot line type.

As shown in FIG. 6, this embodiment is formed by inserting into the waveguide 5 the conductor plate 1 provided with a filter consisting of a ($\lambda/2$) slot resonator 14 which has already been developed as a filter.

In the case of FIG. 6 as well as FIG. 4 the output portion 7 need not necessarily be a waveguide, but the output portion consisting of a slot line can also be coupled to the filter, without any modification of the filter, to a subsequent circuit. The same applies to the following embodiments.

Band Elimination Filter (2-1) Narrow band elimination filter.

FIGS. 7a and 7b show an embodiment of a very narrow band elimination filter constructed by providing the conductor plate 1 with a slot 15 of ($\lambda/2$) in length and then coupling it to an image-type slot line 16. FIG. 8 is a further embodiment of such a filter wherein a pair of slots 15 are formed, and FIGS. 9a and 9b show another embodiment in which a dielectric base plate 17 is made to tightly contact with the conductor plate 1 so as to render the filter more compact.

(2-2) Comparatively wide band elimination filter.

Figure 10:
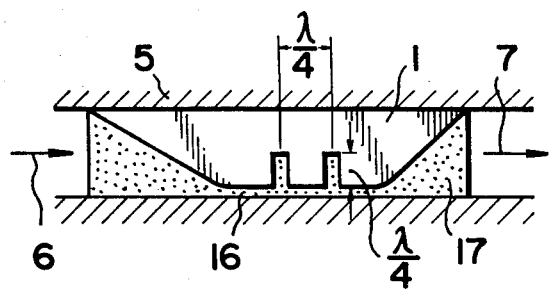
FIGS. 10 and 11 show longitudinal sections of a comparatively wide band elimination filter according to the invention and of a conventional waveguide type, respectively.
Figure 11:
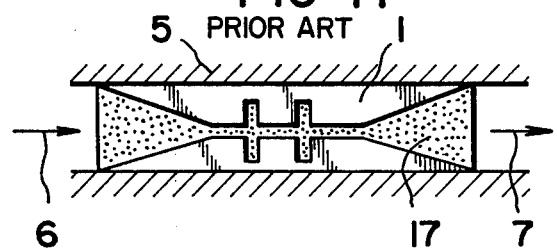

FIGS. 10 and 11 show two embodiments of a comparatively wide band elimination filter according to the invention and of conventional type, respectively. The filter shown in FIG. 10 uses an image type slot line 16 and that in FIG. 11 employs a conventional type slot line, and both of them utilize a dielectric base plate 17 resulting in compactness and ease of construction; otherwise it is difficult as described before to construct the conventional type filter.

Directional Coupler

Figure 12A:
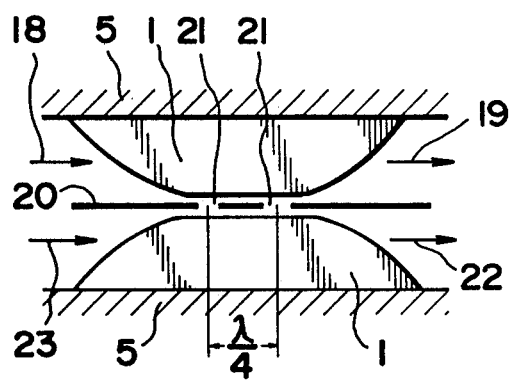
FIGS. 12a and 12b show longitudinal and transverse sections of an embodiment of a directional coupler according to the invention, respectively.
Figure 12B:
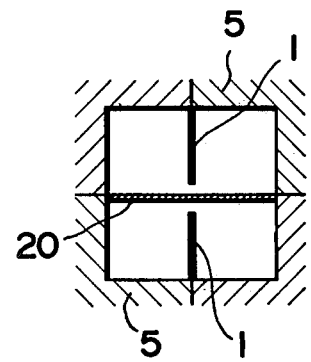

FIGS. 12a and 12b show an embodiment of a directional coupler comprising the combination of image type slot lines and a conductive plate provided with a plurality of coupling apertures and inserted vertically between fins of the slot lines. In FIG. 12a, an input 18 appears at an output 19 and also at an output 22 through coupling apertures 21 of an insertion plate 20. However, with respect to an input 23 electromagnetic waves are added in opposite phases via two coupling apertures 21, so that the input 18 does not appear. A similar reverse characteristic is obtained for the input 23. It is possible to broaden the band width by increasing a number of coupling apertures 21. In FIG. 12a, the openings 18, 19, 22 and 23 are shown as the waveguide openings, but even when parts or all of them are formed by slot lines, similar characteristics are obtained.

Combination with Semiconductor Elements (4-1) Oscillator circuit or mixer circuit.

Figure 13A:
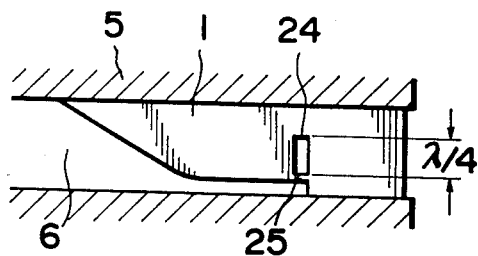
FIGS. 13a and 13b are sectional views of two components for use in an oscillator or mixer circuit according to the invention, respectively.
Figure 13B:
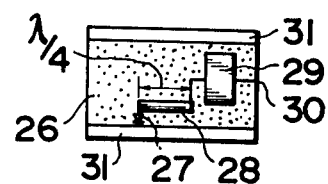
Figure 13C:
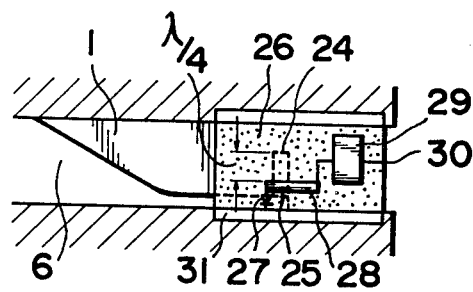
FIGS. 13c and 13d show longitudinal and transverse sections of the oscillator or mixer circuit constructed by assembling said two components, respectively.
Figure 13D:
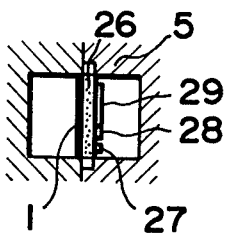

FIGS. 13a, 13b, 13c and 13d show one embodiment of an oscillator circuit or mixer circuit. In the embodiment as shown in FIG. 13a the conductor plate 1 is provided with a slot 24 of ($\lambda/4$) in length with which an L-shaped portion 25 for coupling of diode(s) is formed. As illustrated in FIG. 13b, on a dielectric base plate 26 are arranged a diode 27, a tuning circuit 28 having a length of ($\lambda/4$), a filter 29, an output terminal 30, and ground conductor bands 31 to cover the upper and lower edges of the base plate 26. The dielectric base plate 26 thus constructed is stacked on the conductor plate 1 in such configuration as shown in FIG. 13c, and its transverse section is shown in FIG. 13d. The terminal 6 serves in the case of an oscillator circuit as an output terminal and in the case of a mixer circuit as an input terminal for an incoming signal and a locally oscillating signal. In the case of the mixer circuit, an IF output is derived from the output terminal 30.

(4-2) Up-Converter.

FIGS. 14a and 14b illustrate one embodiment of an up-converter. A microwave input 6 is fed via a filter 32 to a diode 33. As for this filter 32, one of those filters shown in FIGS. 2, 4, 7, etc. can be used. The diode 33 together with a tuning element 34 is mounted previously on a dielectric base plate 35. Reference numeral 36 represents an IF filter of the strip line type which eliminates microwaves. An IF signal is supplied from a terminal 37 so that the diode 33 is excited, resulting in frequency conversion. The frequency-converted signal appears at an output terminal 39 through an output filter 38.

E-Plane Circulator

FIGS. 15a and 15b show an embodiment in which a known circulator of the slot type is inserted into a waveguide 40. As shown in FIG. 15a, the E-plane of the waveguide 40 is branched in the shape of Y. The slot type circulator comprises a Y-branched dielectric base plate 41, on which a Y-branched slot line is formed by metallic covering layers 42, and a ferrite disc 44 is attached to the branching portion 43 of the slot line. A direct current magnetic field is applied to the ferrite disc 44 perpendicular to the E-plane of the waveguide 40. For example, such a d.c. magnetic field is applied to the ferrite disc 44 by means of magnets 45 as shown in FIG. 15b.

Frequency Doubler Circuit

Figure 16A:
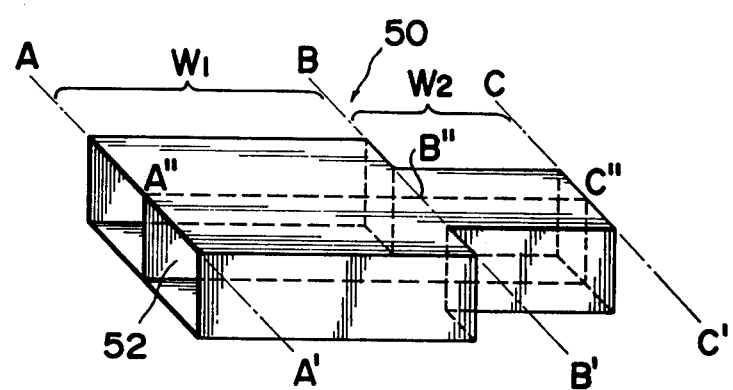
FIG. 16a shows a schematic perspective view of an embodiment of a frequency doubler circuit according to the invention.

As shown in FIG. 16a, a composite rectangular waveguide generally indicated by numeral 50 is constructed by connecting a waveguide portion $W_1$ which passes a fundamental wave to a waveguide portion $W_2$ which passes higher harmonics. At the center of the waveguide 50 in parallel with its E-plane including the line A''-B''-C'' is inserted a plane circuit 52 so called according to the invention and represented by a broken line, which comprises in succession, as shown in FIG. 16b, a fundamental wave pass filter $F_1$, a higher harmonics elimination filter $F_3$, a frequency doubling circuit portion FD and a higher harmonics pass filter $F_2$, each circuit element being constructed such as mentioned before.

Figure 16B:
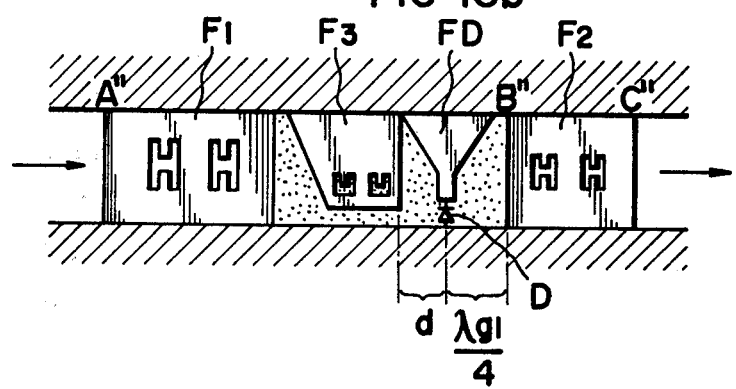

When a fundamental wave is supplied from the left end in FIG. 16b, the fundamental wave which passed through the band pass filter $F_1$ is fed via the image-type slot line to a diode (for example, a varactor diode) D which generates higher harmonics. Then, the higher harmonics generated at the diode D is derived via the band pass filter $F_2$ from the right end of the waveguide.

If in FIG. 16b the distance between the diode D and point B'' is maintained at $\lambda_{g1}/4$ ($\lambda_{g1}$ is wavelength of the fundamental wave inside the waveguide portion $W_1$), the impedance viewed from the diode D towards its right side presents a higher value, so that the fundamental wave is applied to the diode D with very high efficiency. On the other hand, if the distance $d$ of the portion of the slot line in the waveguide portion $W_1$ is chosen so that similarly, the impedance viewed from the diode D towards its left side has a high value, maximum output of the higher harmonics can be obtained. The higher harmonics elimination filter $F_3$ serves to prevent the higher harmonics from leakage towards the left side from the waveguide portion $W_1$.

Switch Circuit

Figure 17A:
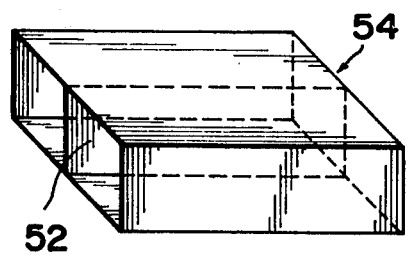
FIGS. 17a through 17d illustrate schematically a diode switch circuit of a travelling wave type and a digital phase shifter employing said switch circuit.
Figure 17B:
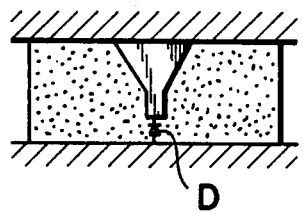
Figure 17C:
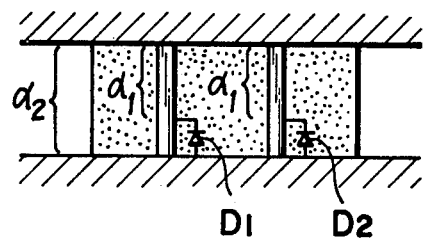
Figure 17D:
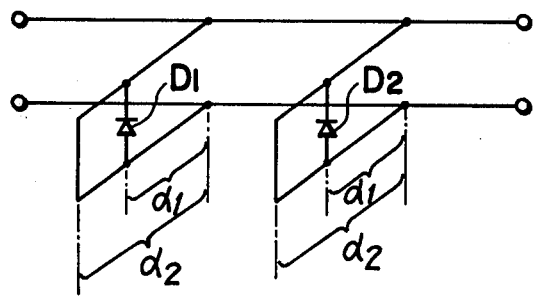

In order to form a plane circuit 52 at the central area of a rectangular waveguide 54 in parallel with its E-plane as shown in FIG. 17a and enable it to operate as a switch circuit of a travelling wave type, a switching diode D is disposed at the location having its both sides coupled to image-type slot lines, respectively, in such a manner that a d.c. voltage can be applied to said diode as shown in FIG. 17b. When the slot line at the location of the diode is short-circuited or made open by connection or disconnection of the d.c. voltage, transmission of electromagnetic waves is also switched on or off. By using such a travelling wave-type diode switch a plane circuit as shown in FIG. 17c can be constructed which provides functions of an equivalent circuit shown in FIG. 17d. That is, a plane circuit is constructed with a plurality of short-circuiting conductive strips in such a manner that parts of the respective conductive strips can be short-circuited or made open by corresponding diodes $D_1, D_2, \ldots$ If phases $\alpha_1$ and $\alpha_2$ indicated in FIG. 17c satisfy the following relations, $(\alpha_1+\alpha_2)/2 = 90°$ and $\alpha_2-\alpha_1 << 90°$ the plane circuit thus constructed provides desired phase variation $\phi$ to the electromagnetic waves fed to the input (for example, the left side) of the waveguide by suitably switching on or off the d.c. voltage applied to the respective diodes $D_1, D_2, \ldots$ so as to short-circuit the diode(s) at proper phase locations(s), and subsequently the electromagnetic waves varied in phase can be derived from the output (for example, the right side) of the waveguide. Accordingly this plane circuit may serve as a digital phase shifter. The phase variation $\phi$ mentioned above can be changed in a digital manner depending upon which of the diodes of which combination of the diodes is short-circuited.

As seen from the respective embodiments mentioned above, the microwave circuits according to the invention are simple in structure so that manufacturing and assembling them are facilitated, thereby enabling them to be produced in large scale. That is to say, as shown in FIG. 3, working to the waveguide is sufficient to divide it into two parts (or four parts in the embodiment of FIG. 12) in parallel with its E-plane, and such configuration can easily be obtained by molding of plastic material. Plastic members thus molded for two halves of a waveguide are subjected to metal plating or covered with metal foil to provide conductivity so that a complete waveguide can be obtained. A conductive plate to be inserted inside of the waveguide requires only a punching operation and moreover electrodes on the dielectric base plate can be constructed by thick film circuits utilizing vapor-deposition or printing techniques so that it is very suitable for mass-production. Furthermore, characteristics of the microwave circuits according to the invention are determined by circuits provided on the base plate to be inserted inside the waveguide, so that making the waveguide of plastic material, etc. which expand or contract slightly depending upon temperature has lesser influence on characteristics. In addition, upon dividing into two parts the waveguide is so split that its split planes are proportioned in parallel with the E-plane and at the center of the H-plane, resulting in such advantage that leakage in current inside the waveguide at the split planes is small.

If desired, the conductive plate which is inserted inside the waveguide in parallel with the E-plane can be located at other than the central portion thereof. However, the cut-off frequency in this case does not become double of that of the waveguide before insertion of such a conductive plate. Moreover, a number of conductive plates to be inserted is not limited to one, but two or more conductive plates can be inserted as shown in FIG. 1b.

While the invention has been particularly shown and described with reference to preferred embodiments thereof, it will be understood by those skilled in the art that various changes in form and details may be made therein without departing from the spirit and scope of the invention.

What is claimed is:

1. In combination with a waveguide having input and output openings and capable of sustaining an electric field along an E-plane parallel to the longitudinal axis of said waveguide, said waveguide having a predetermined first cut-off frequency,
a single conductive flat member mounted within said waveguide in parallel with said E-plane so as to form a cut-off region having a second cut-off frequency at a position where said single conductive flat member is inserted, said single conductive flat member having substantially the same height along the length of the member as the full inner height of said waveguide and uninterrupted straight edges adjacent the input and output openings of said waveguide,
said single conductive flat member including input and output planar circuit elements on a surface thereof adjacent the input and output openings respectively of said waveguide for coupling electromagnetic energy between said input and output openings at the second cut-off frequency, said second cut-off frequency being approximately double said first cut-off frequency when said conductive flat member is positioned substantially along the longitudinal axis of said waveguide, the input electromagnetic field being attenuated sufficiently at said second cut-off frequency to prevent coupling of electromagnetic energy directly between the input and output openings of said waveguide.

2. A microwave circuit according to claim 1 wherein said single conductive flat member is a rectangular plate.

3. A microwave circuit according to claim 1 wherein said single conductive flat member is lined with a nonconductive flat member.

4. A microwave circuit as claimed in claim 1, wherein a plurality of said circuit elements form a bandpass filter both by coupling said circuit elements between each other and by coupling between said circuit elements and a transmission region of the waveguide.

5. A microwave circuit as claimed in claim 4, wherein a plurality of said circuit elements comprise slot circuits which form a lumped constant-type resonator.

* * * * *